(12) United States Patent
Gardner

(10) Patent No.: US 6,424,136 B1
(45) Date of Patent: Jul. 23, 2002

(54) CURRENT INDICATOR FOR FAULT ASSESSMENTS OF LOOP CIRCUIT INTEGRITY WHILE PROVIDING CIRCUIT ISOLATION

(76) Inventor: Robert Gardner, 3, Heol-y-Brace, South Glamorgan. CF62 6SY (GB)

( * ) Notice: Subject to any disclaimer, the term of this patent is extended or adjusted under 35 U.S.C. 154(b) by 0 days.

(21) Appl. No.: 09/530,690

(22) PCT Filed: Nov. 4, 1998

(86) PCT No.: PCT/GB98/03296

§ 371 (c)(1),
(2), (4) Date: May 4, 2000

(87) PCT Pub. No.: WO99/23497

PCT Pub. Date: May 14, 1999

(30) Foreign Application Priority Data

Nov. 4, 1997 (GB) .............................................. 9723164

(51) Int. Cl.⁷ .................... G01R 19/00; G01R 31/08; G01R 19/14
(52) U.S. Cl. .................... 324/76.11; 324/522; 324/133; 324/526
(58) Field of Search .............................. 324/76.11, 522, 324/133, 526; 340/660, 664

(56) References Cited

U.S. PATENT DOCUMENTS

| | | | | | |
|---|---|---|---|---|---|
| 5,111,189 | A | * | 5/1992 | Yeh | 340/664 |
| 5,136,280 | A | * | 8/1992 | Heggli | 340/644 |
| 6,016,105 | A | * | 1/2000 | Schweitzer, Jr. | 340/644 |
| 6,177,875 | B1 | * | 1/2001 | Bolda | 340/660 |

* cited by examiner

*Primary Examiner*—Safet Metjahic
*Assistant Examiner*—Wasseem H. Hamdan
(74) *Attorney, Agent, or Firm*—Young & Thompson

(57) ABSTRACT

A current detector/indicator for DC has a transistor (1) and an LED (2). They are arranged so that current flow through the LED causes the transistor to conduct, shunting excess current away from the LED and through the transistor. For AC, the circuit can be doubled, with transistors and LEDs arranged with inverse polarity. A triac (15) may supplant the two transistors, with parallel, opposed LEDs (16) in its gate circuit.

20 Claims, 7 Drawing Sheets

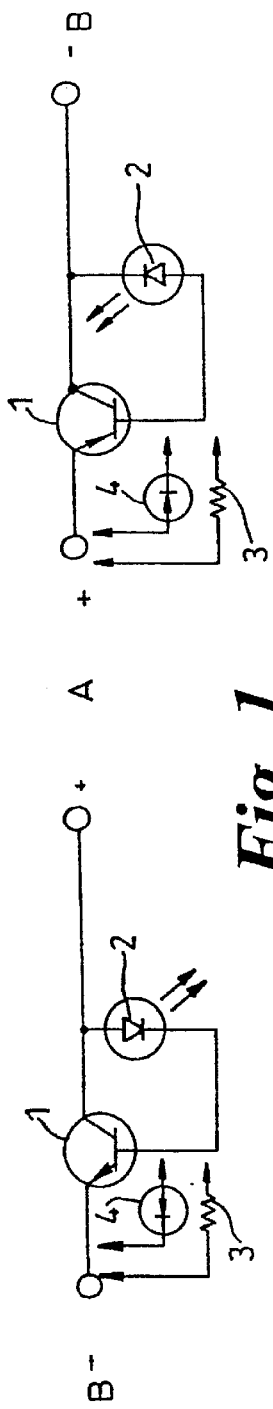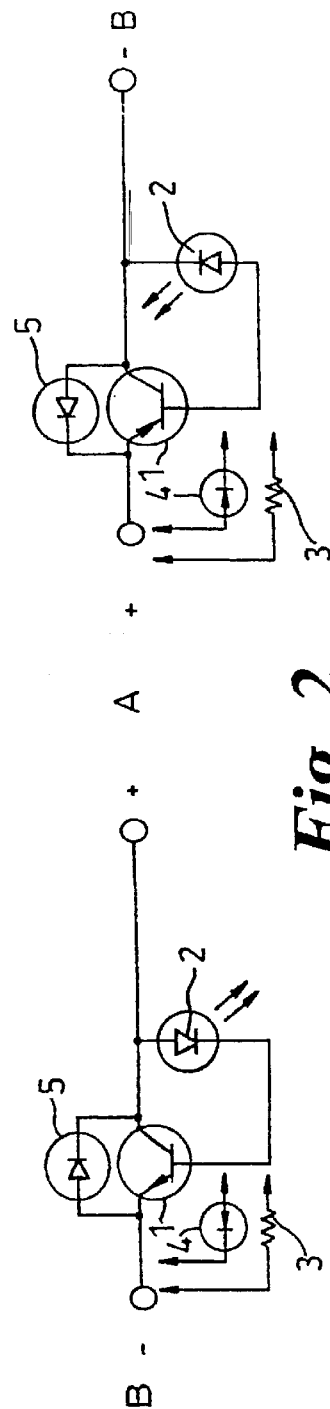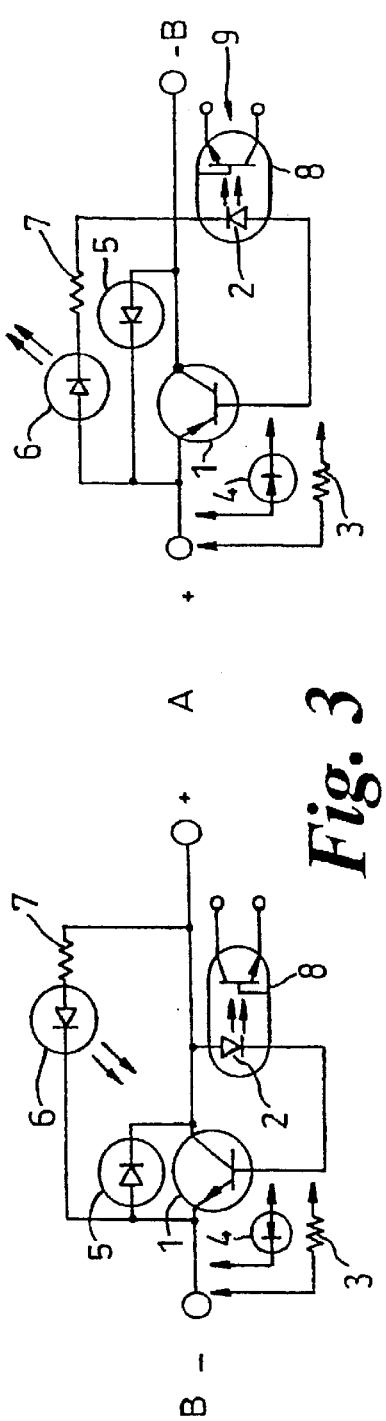

CURRENT INDICATOR FOR FAULT ASSESSMENTS OF LOOP CIRCUIT INTEGRITY WHILE PROVIDING CIRCUIT ISOLATION

BACKGROUND OF THE INVENTION

This invention relates to current detector/indicators and in particular to improved current detector/indicators such as can be utilized by modern control systems as a means to facilitate rapid fault assessment and status of loop circuit integrity while providing circuit isolation. In other words, it is aimed at testing electrical contacts for mechanical and electrical function without breaking power to external circuits. Many uses are envisaged for this device but in particular there is the ability to supply visible information on whether a current is flowing in a circuit or not and to supply an isolated switched output of that information.

Light emitting diodes are excellent devices to indicate current flow but are generally limited in their current capacity to a maximum of 100 mA and are very prone to damage from reverse voltages of low magnitude. They exhibit extremely long life if subject to their design ratings of current and voltage and consume little. In this specification, it should be understood that as well as 'ordinary' LEDs, such as are used in many indicators, it would also be possible to use laser diode type LEDs.

SUMMARY OF THE INVENTION

According to the present invention there is provided a current indicator comprising a transistor and an LED in circuit therewith and arranged to have a controlling influence thereon, current flow through the LED energising it and thereby causing the transistor to conduct and shunt excess current away from the LED and through the transistor.

In a preferred, simple form for indication of DC or one polarity of AC, there is one transistor and the LED is connected across its collector and base. The LED can be part of an opto-isolator capable of providing a remote indication of current flow, in which case another LED in circuit with the transistor might be arranged to be energised when the transistor is conducting, thereby to provide local indication of current flow. This other LED can be connected across the emitter and collector.

For indicating both polarities of AC, the indicator can be doubled with two transistors connected in inverse parallel.

In another convenient form the transistor is a triac in an AC power line which may pass current selectively full wave or either half wave, and wherein there are two LEDs, in parallel with reversed polarities, in the triac's gate circuit arranged to trigger the triac into conduction when power is on the line, each LED being energized with the gate trigger current during the associated half wave conduction through the triac but extinguishing when the triac avalanches into conduction.

Again, each LED can be part of an opto-isolator capable of providing a remote indication of current flow, in which case another LED in series with each first LED may provide local indication of current flow.

Whenever there are two LEDs for visible indication of current they may be combined into a bi-color LED, AC being indicated by a mixture of the colors. More usefully, four different conditions may be delivered via two wires by way of two switches isolated by two inversely polarised diodes.

PNP and NPN transistors are usable. Where the circuit is doubled, two transistors of the same type may be used, or complementary PNP and NPN transistors.

Preferably, the transistor(s) will have reverse voltage protection, for example by a diode across the collector and emitter.

In one arrangement, a load may be energized through a power diode, across which is connected the emitter and base of a transistor, the collector being connected through the LED to the other side of the load. There could be two LEDs in parallel or series, one being for local indication and the other being part of an opto-isolator. It is important that the power diode and the transistor share a common thermal environment for reliable operation.

BRIEF DESCRIPTION OF THE DRAWINGS

For a better understanding of the invention, some embodiments will now be described, by way of example, with reference to the accompanying drawings, in which:

FIGS. 1 to 11 and FIGS. 13 to 15 are circuit diagrams of current indicators.

DETAILED DESCRIPTION OF THE PREFERRED EMBODIMENTS

Figure 5:
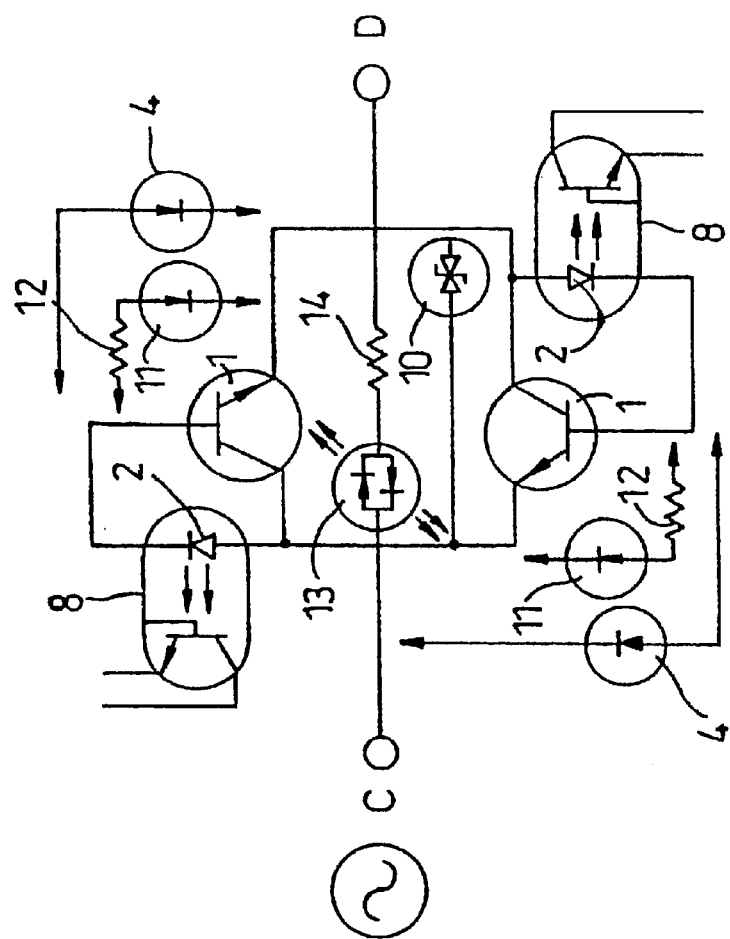

In each of FIGS. 1 to 3, there are two versions of the circuit, one with an NPN transistor, the other with a PNP transistor. They each work in a similar fashion and will be described as one circuit.

A basic current indicator is shown in FIG. 1 and consists of a transistor 1 and an LED 2 coupled across the collector and base of the transistor, which is between terminals A (positive) and B (negative).

A resistor 3 or diode 4 between the base and emitter of the transistor 1 can enhance the sensitivity of the device, but neither is essential to its working. They are therefore not illustrated with definite connections, but the arrows indicate their position, if used. The polarity of the diode 4 matches that of the transistor junction.

When conducting, the voltage drop Vf across the base-emitter junction of the transistor is typically 0.6 V while the forward voltage of the LED varies with colour and type between 1.0 V for infra-red types to 4.0 V for certain colors. The voltage drop that appears across terminals A and B when there is current flow is the sum of the transistor emitter-base Vf plus that of the LED and will therefore be of the order 1.6 to almost 5 V.

With terminal A positive in relation to terminal B, the LED 2 will pass current through the base-emitter junction of the transistor 1 and force the transistor into collector-a emitter conduction. This diverts current from the LED, which is typically limited to a maximum capacity of 100 mA.

The circuit will control the voltage drop across itself and of course the presence of current is indicated by the illumination of the LED.

FIG. 2 is essentially the same as FIG. 1, but with the addition of a diode 5 across the transistor oriented to provide reverse volts protection. LEDs are very prone to damage from reverse voltage even of low magnitude.

FIG. 3 extends this arrangement in two respects. First there is another LED 6, in series with a resistor 7, in parallel with the diode 5 across the transistor. The resistor 7 will be of the order of 10 ohms and serves to control the current in the LED 6, which will illuminate when current flows from A to B and serve as a local indicator.

The LED 2, however, is now part of an opto-isolator 8, and when conducting and radiating it will produce an output at 9 which can be fed to a remote station.

Figure 4:
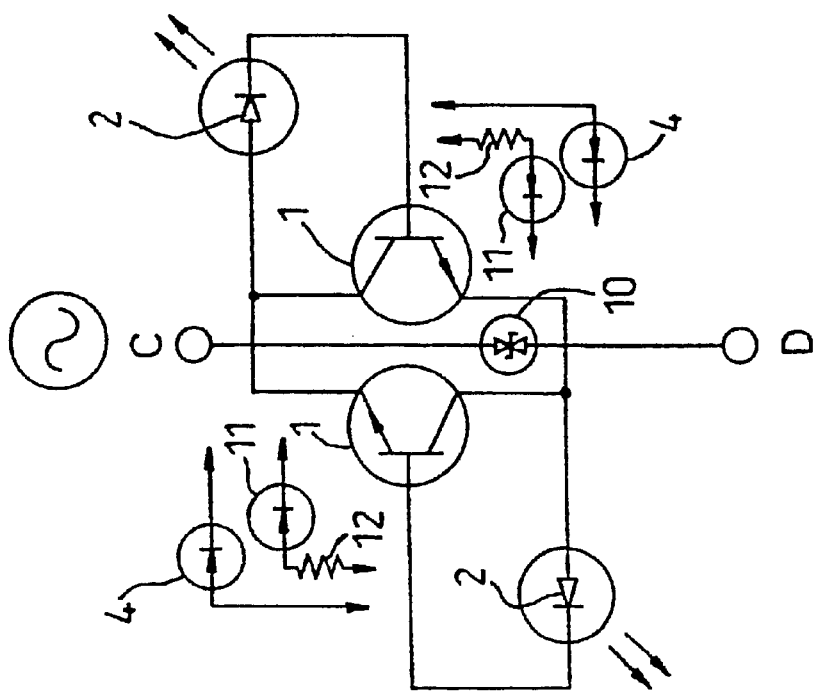

These circuits are useful for DC or where there is interest only in one polarity of an AC current. An arrangement for detection or indication of AC across terminals C and D is shown in FIG. 4, using NPN transistors. A PNP version is equally possible or a combination of PNP and NPN transistors. FIG. 4 is essentially a doubling of FIG. 2, with similar transistors 1 connected in reversed polarity arrangement, collectors to emitters, with their associated LEDs 2 as in FIG. 2, and with the diodes 5 combined into a transient suppressor 10. It will be appreciated that the LEDs illuminate alternatingly in synchronism with the half cycles of the AC and enable four different conditions to be indicated by different combinations of light.

For improved sensitivity a single diode 4 may be connected between the base and emitter of each transistor, as in previous figures, or a diode 11 and resistor 12 in series, as illustrated. The diode provides a minimal current path for the associated LED without turning the transistor on, but enough to exploit the minimum current illumination of the LED, which may be of the order of 0.5 mA.

FIG. 5 shows a combination of the circuits of FIGS. 3 and 4. The LEDs 2 each form part of an opto-isolator 8 as in FIG. 3, while instead of two separate LEDs 6 and separate resistors 7, these can be merged into a single bi-color LED 13 and a single resistor 14 in parallel with the transistors. The different colors will illuminate alternately, but with anything other than very low frequencies they will appear as two side by side continuous colours when AC is present.

Figure 6:
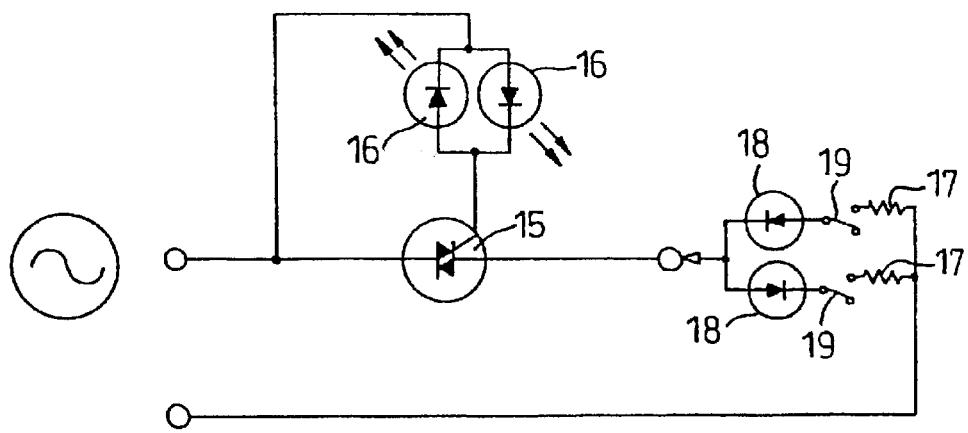

Instead of two separate transistors a triac 15 may be used as shown in FIG. 6. Its gate stimulation is via two inversely connected LEDs 16, and here they are used to detect and relay information on two different loads 17 which, with associated diodes 18 (inversely arranged) and switches 19, are in parallel in the power circuit. Only two wires are necessary, thereby reducing wiring costs to both input and output circuits of a control system. The LEDs 16 each serve in turn to pass current to the triac gate until the triac switches on. Thereafter the triac 15 assumes the full load current (LED turns off) with its Vf falling to less than one volt (insufficient to maintain an LED "on") until the supply passes through the 0 volt part of its supply curve.

This routing of the gate current for the triac 15 through two inversely polarized LEDs 16 causes it to trigger into conduction at a point determined by the Vf of the LED and the polarity of each half cycle. Because the supply is an alternating current they will light at a frequency determined by the supply frequency but 180 degrees opposed. Together they effectively double the supply frequency. The LEDs mirror the action of the switches 19 and illuminate to indicate whichever or both switches are passing current.

Figure 7:
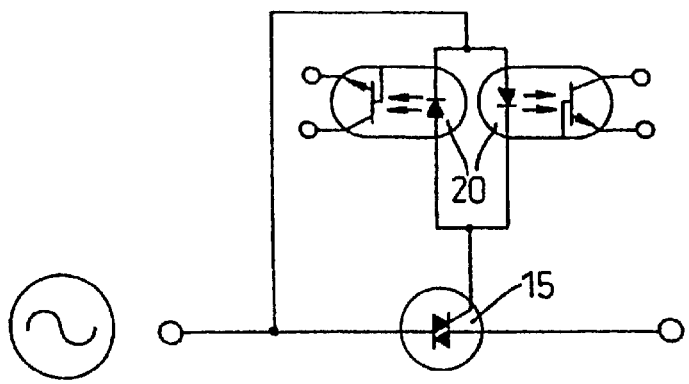

An alternative isolated system can be realised to act as a feedback to the control system as shown in FIG. 7, utilising opto-isolators 20 instead of visible LEDs.

Figure 8:
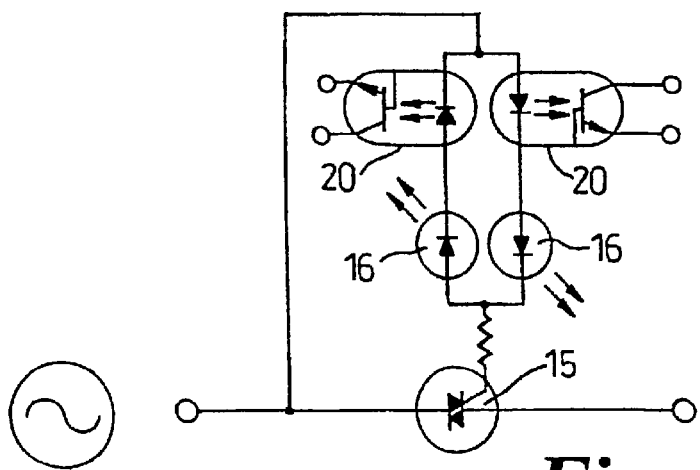

The systems of FIGS. 6 and 7 could be combined as shown in FIG. 8, where the parallel branches in the gate circuit each have an LED 16 and an opto-isolator 20.

Figure 9:
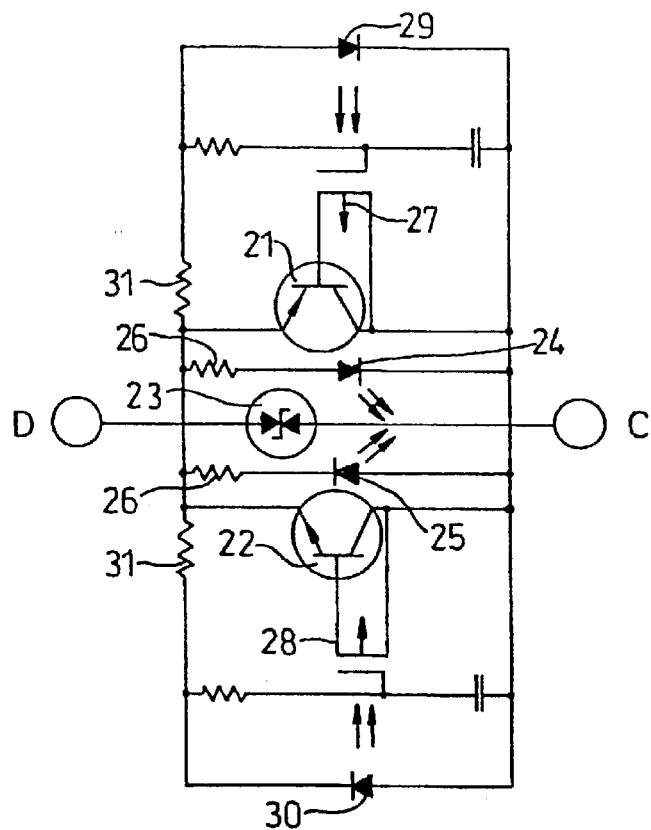

FIG. 9 shows a PNP transistor 21 and an NPN transistor 22 with collectors to terminal C and emitters to terminal D. A transient suppressor 23 and LEDs 24 and 25 with inverse polarity and each with a series resistor 26 are in parallel across these terminals. Across the base and collector of each bi-polar transistor there is a MO-SFET, the PNP transistor 21 having an N-channel device 27 and the NPN transistor 22 having a P-channel device 28. Their gates are photo coupled to respective LEDs 29 and 30 of opposite polarity across the terminals C and D, each in series with a resistor 31.

Whichever LED 29 or 30 is conductive illumines and switches on the associated MOS-FET 27 or 28, which in turn makes the associated bipolar transistor 21 or 22 conductive.

Figure 10:
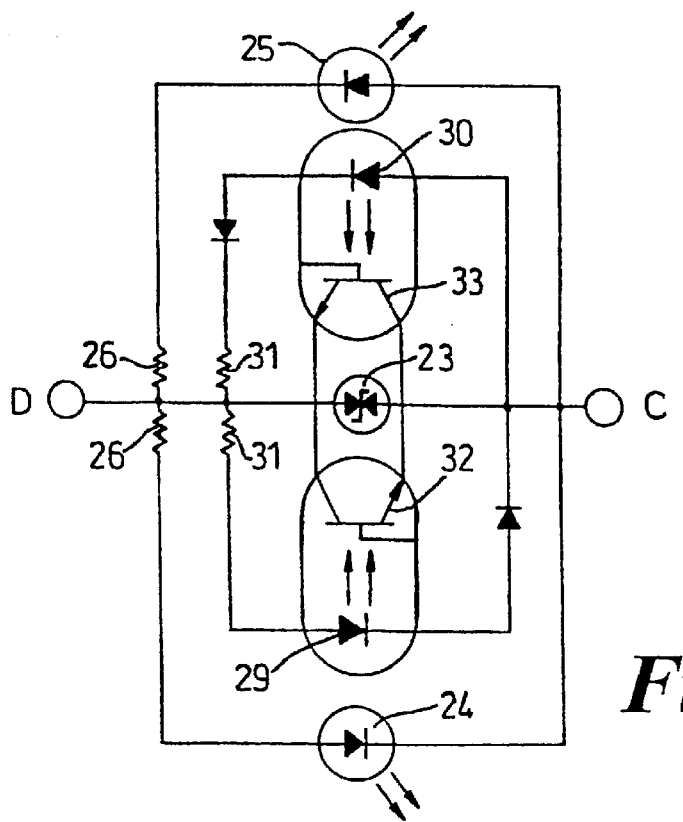

FIG. 10 can be regarded as a simpler version of FIG. 9 and corresponding parts are similarly referenced. Two NPN transistors 32 and 33 are connected across terminals C and D with reverse polarity and the associated LEDs 29 and 30 photo couple directly to the bases of these bipolar devices.

Figure 11:
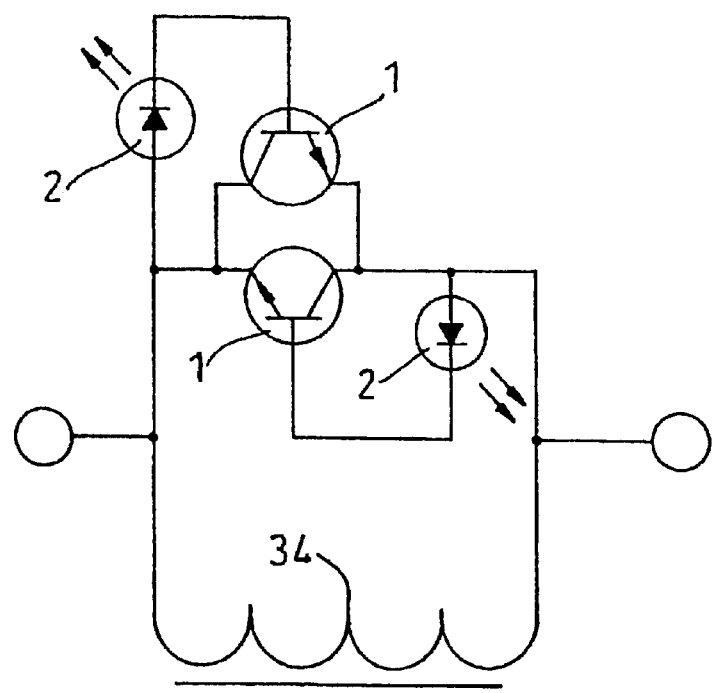
Figure 12:
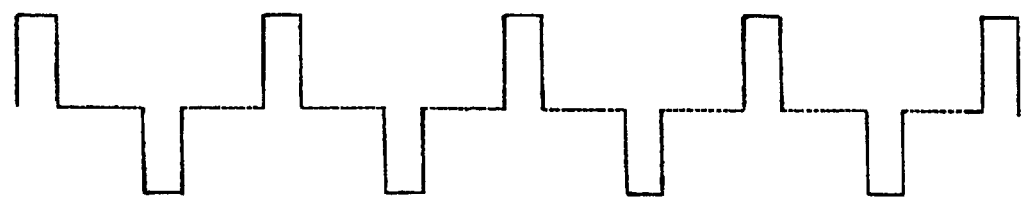
FIG. 12 shows a waveform associated with FIG. 11.

FIG. 11 shows the circuit of FIG. 4 (less the transient suppressor) across an inductor 34 which is energised with alternating positive and negative pulses of low voltage (less than one volt) but significant current, as shown by the full lines of FIG. 12. In this case, the LEDs 2 will light out of phase with the actual current in the inductor 35, over the periods indicated by the dotted lines in FIG. 12. They will be energized by the collapsing magnetic field generating a reverse current. The LEDs 2 therefore indicate that a current has just been present in the inductor.

All the above circuits are intended to be inserted into a current carrying conductor and to derive their power for operation from the line. Adequate precautions will be taken to protect the devices against current overload and transient voltage spikes.

Figure 13:
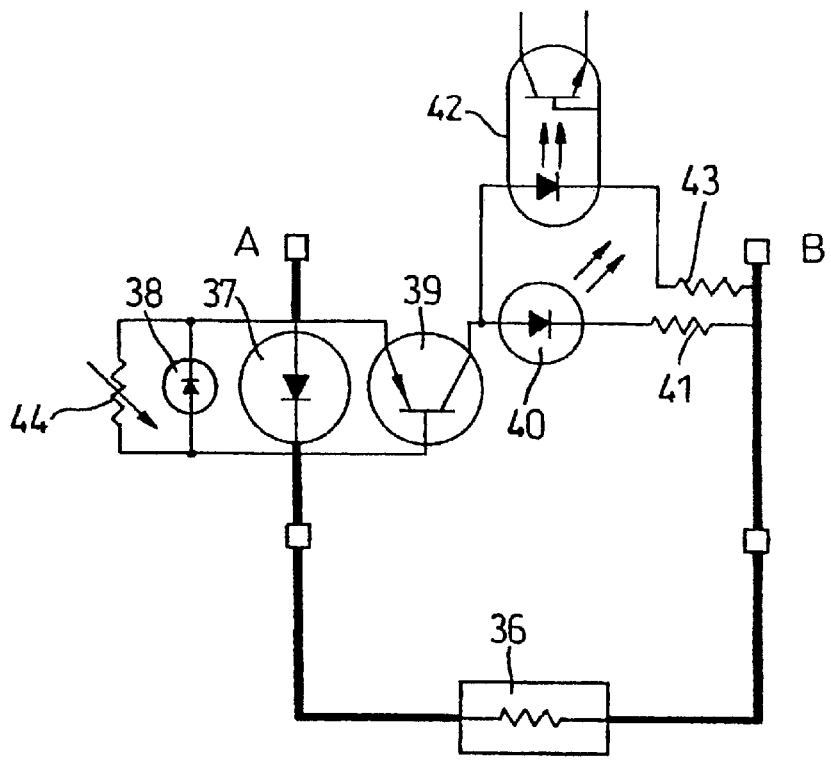

In FIG. 13 a simple DC arrangement is shown where the load 36 is energised through a power diode 37 with a reverse volts protection diode 38 in parallel. A PNP transistor 39 has its emitter connected to the positive (terminal A) side of the diodes and its base to the load side. The collector circuit has an LED 40 and resistor 41 in parallel with an opto-isolator 42 and resistor 43, both connected to the zero volts terminal B.

The voltage drop across the power diode 37 when the load is carrying current makes the transistor 39 conductive and generates a response in the LED 40 and from the opto-isolator 42. A variable resistor 44 of 0.6 to 600 ohms could be included across the diodes 37 and 38 as shown as a means of establishing an adjustable threshold for the LEDs to illuminate at different current levels. Any lack of integrity of the load circuit will indicate locally and feed back to a remote station.

Figure 14:
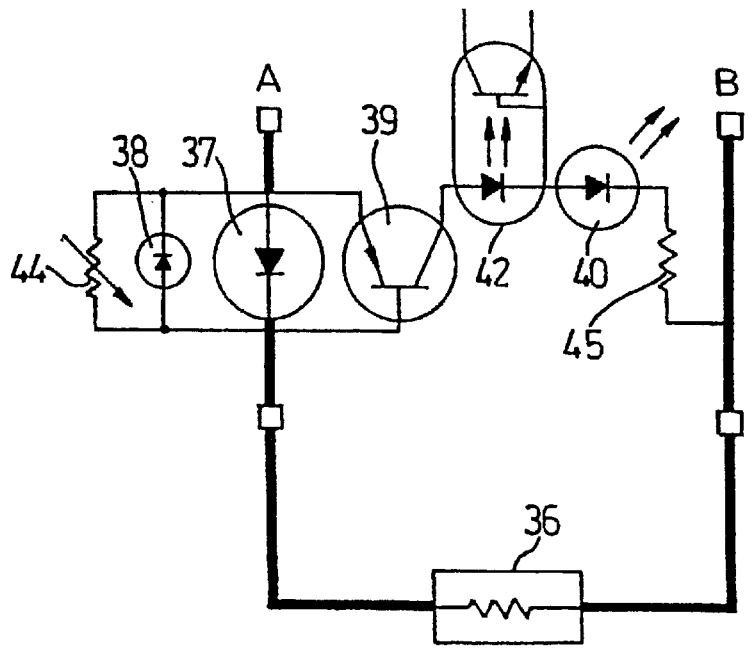

FIG. 14 shows a generally similar circuit but with the LED 40 in series with the opto-isolator 42, and with a single resistor 45.

Similar arrangements are possible using an NPN transistor.

The indicator of FIGS. 13 and 14 require that the return power line is close at hand to power the L.E.D. and that the arrangement can tolerate another circuit path shunted elsewhere without degrading the information in that circuit.

Figure 15:
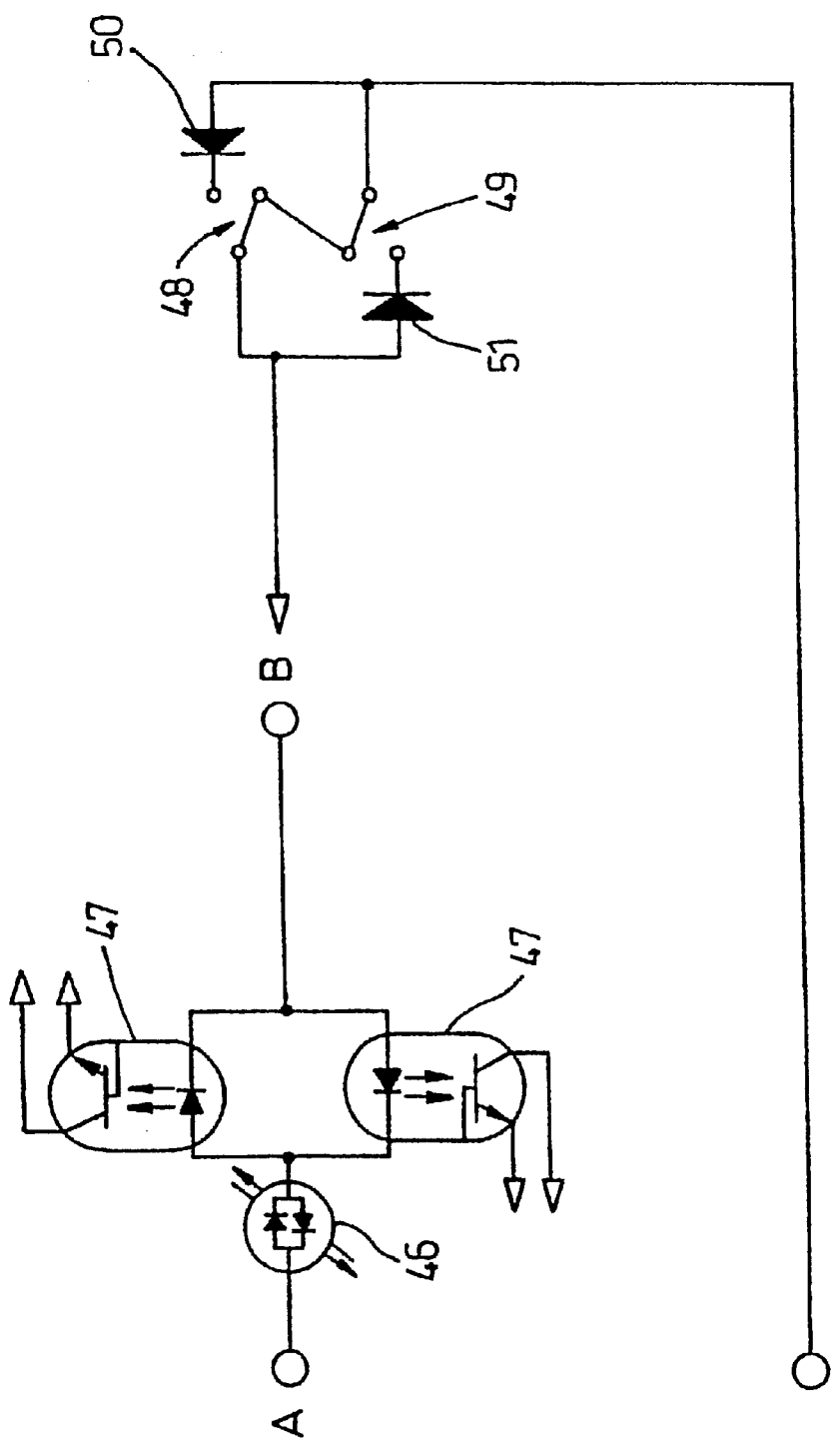

FIG. 15 shows a further circuit suitable for use when "intrinsically safe" regulations apply. This is where power to the field circuits is mandatorily low, negating the need for power transistors but exploiting the ability of the device to interpret four bits of information form two wires.

Between terminals A and B to which AC is applied there is a bi-color LED 46 in series with two opto-isolators 47 in parallel, their LEDs being arranged with inverse polarity. The circuit continues beyond terminal B to a double switch assembly 48 and 49 with associated diodes 50 and 51.

The switches may be coupled to some device such as a valve, and in the position shown this valve is in an intermediate position, neither open nor closed. Both parts of the LED 46 will be on, and both opto-isolators energized.

If the valve is fully opened, the upper switch 48 closes, bringing the diode 50 into circuit. The corresponding part of the LED 46 and one of the opto-isolators will be on. Likewise, if the valve is fully closed, the lower switch 49 closes and the other pat of the LED 46 and the other opto-isolator 47 will be on.

If there is no illumination from the LED, there must be a fault.

This arrangement can be applied to the circuits of FIGS. 4, 5, 9, 10 and 11.

Whilst the invention has been described above, it extends to any inventive combination of the features set out in the introduction or the description.

What is claimed is:

1. A current detector for determining presence or absence of electrical current comprising:
    two similar circuits in parallel branches, each said circuit including a transistor (1), the transistors being arranged within the respective said circuits to be conductive in directions opposite to one another;
    an LED (2) connected across a collector and base of each said transistor (1); and
    a diode (4,11) connected across the base and an emitter of each said transistor (1);
    wherein as forward current increases through one of said parallel branches, the forward current flows through the LED (2) and the diode (4,11) in said branch, energizing the LED (2), and then causes, by virtue of a voltage developed across the base and the emitter, the transistor (1) in said branch to conduct and shunt current therethrough.

2. A current detector as claimed in claim 1, wherein each LED (2) is part of an opto-isolator (8).

3. A current detector as claimed in claim 2, further comprising parallel LEDs (13) connected anode-to-cathode with one another, the parallel LEDs being connected in series with a resistor (14), the series arrangement of the parallel LEDs and the resistor being connected across the collectors and the emitters of both of the transistors (1).

4. A current detector as claimed in claim 3, further comprising a transient suppresser (10) connected across the collectors and the emitters of the transistors (1).

5. A current detector as claimed in claim 4, the transistors (1) are one of matching NPN and matching PNP transistors.

6. A current detector as claimed in claim 3, wherein the transistors (1) are one of matching NPN and matching PNP transistors.

7. A current detector as claimed in claim 6, wherein the transistors are complementary NPN and PNP transistors.

8. A current detector as claimed in claim 3, wherein the transistors are complementary NPN and PNP transistors.

9. A current detector as claimed in claim 2, further comprising a transient suppresser (10) connected across the collectors and the emitters of the transistors (1).

10. A current detector as claimed in claim 9, wherein the transistors (1) are one of matching NPN and matching PNP transistors.

11. A current detector as claimed in claim 2, wherein the transistors (1) are one of matching NPN and matching PNP transistors.

12. A current detector as claimed in claim 11, wherein the transistors are complementary NPN and PNP transistors.

13. A current detector as claimed in claim 2, wherein the transistors are complementary NPN and PNP transistors.

14. A current detector as claimed in claim 1, further comprising two transient suppressers (10) connected across the collectors and the emitters of the transistors (1).

15. A current detector as claimed in claim 14, wherein the transistors (1) are one of matching NPN and matching PNP transistors.

16. A current detector as claimed in claim 15, wherein the transistors are complementary NPN and PNP transistors.

17. A current detector as claimed in claim 14, wherein the transistors are complementary NPN and PNP transistors.

18. A current detector as claimed in claim 1, wherein the transistors (1) are one of matching NPN and matching PNP transistors.

19. A current detector as claimed in claim 18, wherein the transistors are complementary NPN and PNP transistors.

20. A current detector as claimed in claim 1, wherein the transistors are complementary NPN and PNP transistors.

\* \* \* \* \*